United States Patent

Kumashiro

[11] Patent Number: 6,144,929
[45] Date of Patent: Nov. 7, 2000

[54] METHOD OF SIMULATING IMPACT IONIZATION PHENOMENON IN SEMICONDUCTOR DEVICE

[75] Inventor: Shigetaka Kumashiro, Tokyo, Japan

[73] Assignee: NEC Corporation, Tokyo, Japan

[21] Appl. No.: 09/137,139

[22] Filed: Aug. 20, 1998

[30] Foreign Application Priority Data

Aug. 21, 1997 [JP] Japan .................................. 9-225147

[51] Int. Cl.⁷ .................................................. G06F 17/50
[52] U.S. Cl. ...................... 703/2; 703/4; 703/5; 716/20
[58] Field of Search ............................ 703/2, 4, 5, 13; 716/20; 345/423; 700/98, 121

[56] References Cited

U.S. PATENT DOCUMENTS

| | | | |
|---|---|---|---|
| 5,617,322 | 4/1997 | Yokota | 700/98 |
| 5,677,846 | 10/1997 | Kumashiro | 716/20 |
| 5,774,696 | 6/1998 | Akiyama | 716/20 |
| 5,798,764 | 8/1998 | Akiyama | 345/423 |
| 5,828,586 | 10/1998 | Yokota | 716/20 |
| 5,889,680 | 3/1999 | Yokota | 703/4 |

OTHER PUBLICATIONS

R. Dang et al., A Highly Efficient Adaptive Mesh Approach to Semiconductor Device Simulation–Application to Impact Ionization Analysis, IEEE Transactions on Magnetics, vol. 27, No. 5, Sep. 1991, pp. 4162–4165.

S. Laux et al., "A General Control–Volume Formulation for Modeling Impact Ionization in Semiconductor Transport", IEEE Transactions on Electron Devices, vol. ED.–32, No. 10, Oct. 1985, pp. 2076–2082.

Ryo Dan ed., "Process Device Simulation Technique", pp. 91–134.

*Primary Examiner*—James P. Trammell
*Assistant Examiner*—Russell W. Frejd
*Attorney, Agent, or Firm*—Sughrue, Mion, Zinn, Macpeak & Seas, PLLC

[57] ABSTRACT

A method of simulating an impact ionization phenomenon of a semiconductor device, by which an electric characteristic concerning the impact ionization phenomenon of the semiconductor device is obtained by setting a mesh in a space and by solving a Poisson equation, an electron current continuity equation and a hole current continuity equation which are discretized by what is called a control volume method. Further, regarding a current density defined on a mesh edge connecting adjacent mesh points, different values are used as an evaluation value of the current density at an upstream side, at which a carrier is cased to drift, and an evaluation value of the current density at a downstream side, respectively. Moreover, the difference between the current densities respectively obtained at the upstream side and the downstream side are set in such a manner as to be equal to a multiplication carrier current density caused by impact ionization of the carrier in the control volume corresponding to an edge of the mesh.

7 Claims, 4 Drawing Sheets

METHOD OF SIMULATING IMPACT IONIZATION PHENOMENON IN SEMICONDUCTOR DEVICE

BACKGROUND OF THE INVENTION

The present invention generally relates to a method of simulating the electric characteristics of a semiconductor device by a computer, and more particularly, to a method of simulating an impact ionization phenomenon of carriers in a semiconductor device.

A computer simulation method of simulating the electric characteristics in a semiconductor device is described in Ryo Dan ed., "Process Device Simulation Technique", pp. 91–134 (hereunder referred to as a first literature). In this example, a region to be analyzed is divided into a mesh of subsections or elements. Further, at each mesh point (or node), a Poisson equation, an electron current continuity equation, and a hole current continuity equation are discretized. Moreover, these equations are linearized and then solved by using a Newton's method.

What, is called a control volume method described on page 114 of the first literature is widely used for the discretization of equations.

An approach for introducing a term concerning carrier generation by impact ionization under a high electric field into the current continuity equations discretized by such a control-volume method is explained in, for example, "Numerical Formulation" section on page 2077 of S. E. Laux and B. M. Grossman, "A General Control-Volume Formulation for Modeling Impact Ionization in Semiconductor Transport," IEEE Trans. Electron Devices, vol. ED-32, no. 10, pp. 2076–2082 (hereunder referred to as a second literature).

The current density of electric current flowing through a mesh edge (or side or branch) is given by an equation (3.68) described in the first literature and an equation (3) described on page 2077 in the second literature by the use of a Scharfetter-Gummel scheme described on pages 119–122 of the first literature.

A simulation of an impact ionization phenomenon occurring in a semiconductor device in a stationary state can be realized by employing these equations and a current continuity equation in a case where impact ionization components are main components in the stationary state, and the Poisson equation as simultaneous equations, and then solving the simultaneous equations by using a suitable boundary condition.

However, the aforementioned prior art method of simulating an impact ionization phenomenon in a semiconductor device has a problem in that instability occurs when calculating data representing a state where a noticeable impact ionization is caused in a high electric field.

The prior art methods disclosed in the first and the second literature references employ a formulation by which an amount of generated carriers is first evaluated by using the current density of electric currents flowing from control volumes, and by which the evaluated amounts of generated carriers are then assigned or partitioned to the control volumes that act as sources of electric current, and a positive feedback is locally performed. Thus, when the ionization coefficient corresponding to the electron density at a mesh point increases due to a rise in the magnitude of the electric field, namely, when the electric field rises so that the ionization coefficient increases, the simulation comes upon a situation in which the coefficient corresponding to the carrier density in the discretized current continuity equation becomes zero. The occurrence of this situation means that the carrier density can have an arbitrary value. As a result, the simulation becomes unstable.

As a measure to avoid an occurrence of the instability, there has been devised a prior art method of shifting a point, at which the coefficient corresponding to the carrier density becomes zero, toward a high electric field side by decreasing the distance L between mesh points. However, generally, the ionization coefficient $\alpha$ increases exponentially with an increase in the magnitude of the electric field E. Thus, in the case of employing this method, the required number of elements of a mesh increases exponentially with an increase in the magnitude of the electric field E. Consequently, a computation time duration exponentially increases. Therefore, this prior art method is of no practical use.

SUMMARY OF THE INVENTION

Accordingly, an object of the present invention is to provide a method of simulating an impact ionization phenomenon of a semiconductor device, by which a simulation can be stably performed.

To achieve the foregoing object, in accordance with the present invention, there is provided a first method of simulating an impact ionization phenomenon of a semiconductor device, by which an electric characteristic concerning the impact ionization phenomenon of the semiconductor device is obtained by setting a mesh in a space and by solving a Poisson equation, an electron current continuity equation and a hole current continuity equation which are discretized by what is called a control volume method. In the case of this method, a coefficient corresponding to a carrier density in an equation obtained by discretizing the electron current continuity equation and the hole current continuity equation is made to become except zero.

Further, in accordance with the present invention, there is provided a second method embodying the aforementioned first method of simulating an impact ionization phenomenon of a semiconductor device. In the case of the second method, regarding a current density defined on a mesh edge connecting adjacent mesh points, different values are used as an evaluation value of the current density at an upstream side, at which carriers are caused to drift, and an evaluation value of the current density at a downstream side, respectively.

Moreover, in accordance with the present invention, there is provided a third method embodying the aforementioned second method of simulating an impact ionization phenomenon of a semiconductor device. The third method has a step of setting a difference between the current densities respectively obtained at the upstream side and the downstream side in such a manner as to be equal to a multiplication carrier current density caused by impact ionization of the carrier in the control volume corresponding to a mesh edge.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DESCRIPTION OF THE PREFERRED EMBODIMENTS

Figure 1A:
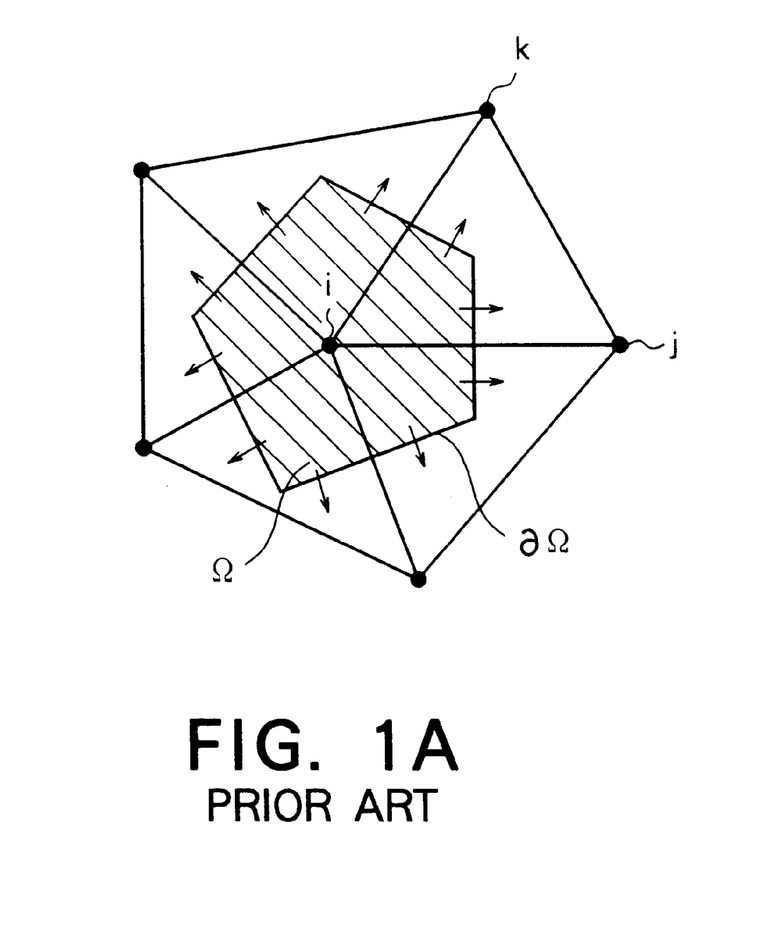
FIGS. 1A and 1B are diagrams illustrating the positional relation among various kinds of physical quantities in the case of applying the prior art methods for simulating impact ionization phenomena, onto two-dimensional structures.
Figure 1B:
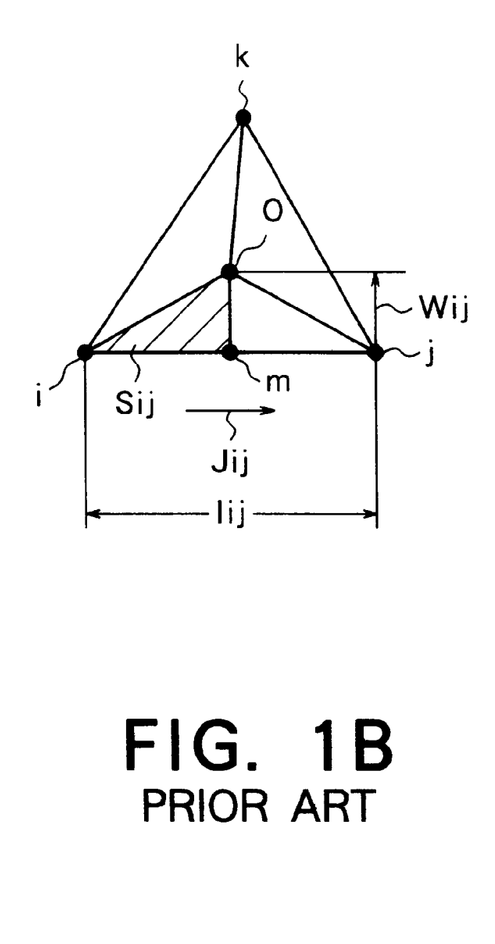
Figure 2:
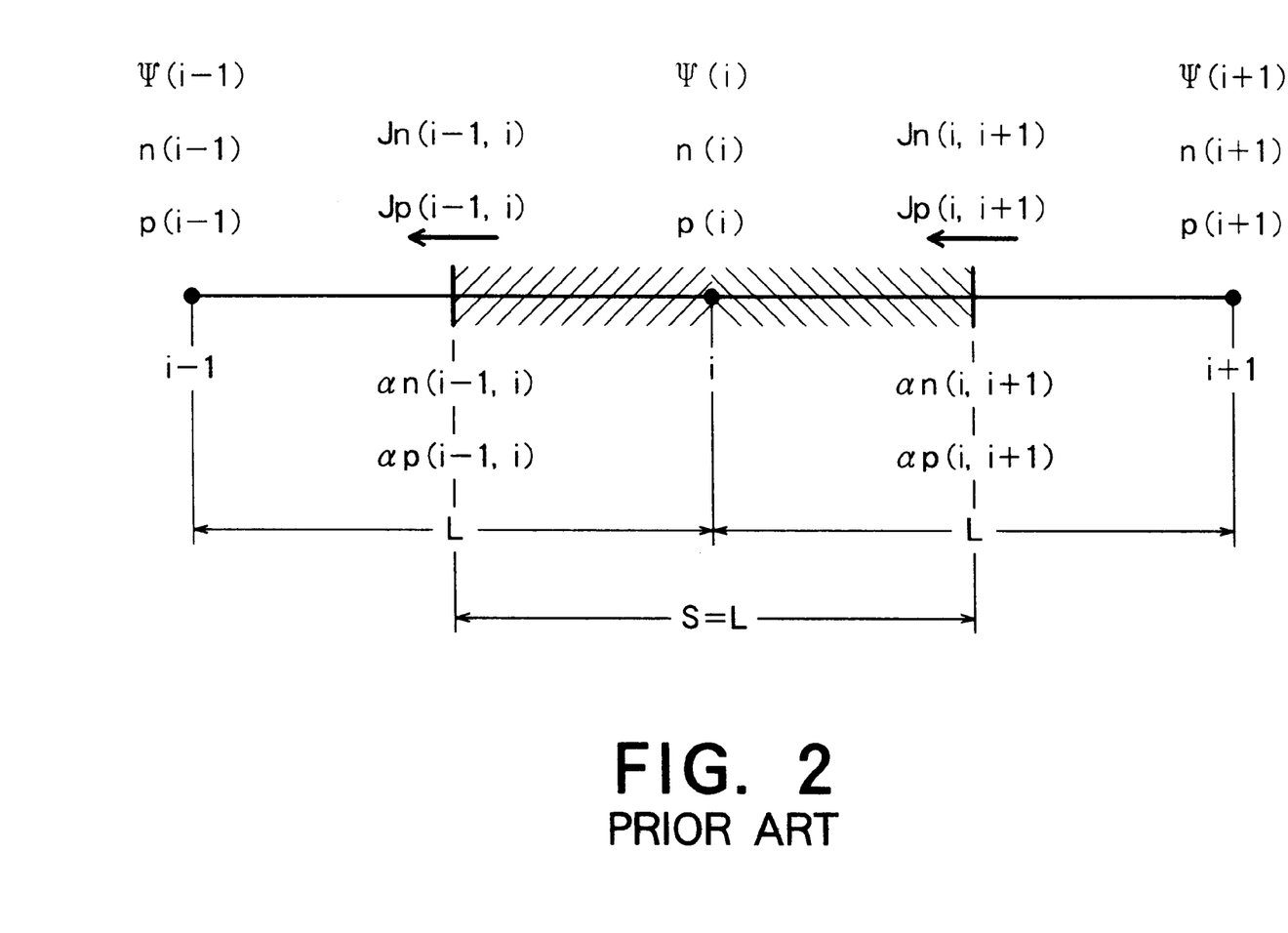
FIG. 2 is a diagram illustrating the positional relation among various kinds of physical quantities in the case of applying the prior art method of simulating an impact ionization phenomenon, onto a one-dimensional structure.

First, for a better understanding of the present invention, the aforementioned prior art methods for simulating an impact ionization phenomenon occurring in a semiconductor device will be further described in detail by referring to FIGS. 1A, 1B, and 2.

In the case of the aforementioned prior art simulation method of simulating the electric characteristics described on pages 91–134 in the first literature, a region to be analyzed is divided into a mesh of subsections or elements. Further, at each mesh point, a Poisson equation, an electron current continuity equation and a hole current continuity equation are discretized. Moreover, these equations are linearized and the solved using the Newton's method or the like. Then, solutions to these equations are obtained.

Especially, what is called a control volume method described on page 114 of the first literature is widely used for the discretization of equations.

A method of introducing a term concerning carrier generation by impact ionization under a high electric field into the current continuity equations discretized by such a control-volume method is explained in, for example, "Numerical Formulation" section on page 2077 of the aforementioned second literature.

Hereinafter, this method will be briefly described.

Consider the case that the following electron current continuity equations (1) and (2) and the following hole current continuity equations (3) and (4) are converted into algebraic equations by performing the discretization of the following equations (1) to (4) based on physical quantities at mesh points.

$$\frac{\partial n}{\partial t} = \frac{1}{q} \nabla \cdot J_n + G_n - R_n \tag{1}$$

$$J_n = -q\mu_n n \nabla \varphi + q D_n \nabla n \tag{2}$$

$$\frac{\partial p}{\partial t} = -\frac{1}{q} \nabla \cdot J_p + G_p - R_p \tag{3}$$

$$J_p = -q\mu_p p \nabla \psi - q D_p \nabla p \tag{4}$$

In the equations (1) to (4), n, p and ψ designate an electron density, a hole density, and electrostatic potential, respectively. Further, Jn and Jp denote an electron current density and a hole current density, respectively. Moreover, μn and μp represent the mobility of electrons and that of holes, respectively. Dn and Dp indicate the diffusion constant of an electron and that of a hole. Gn and Gp designate the generation rate of electrons and that of holes, respectively. Rn and Rp denote the recombination rate of electrons and that of holes, respectively. In the case of the discretization of a two-dimensional structure, the equations (1) and (3) are converted into the following equations (5) and (6) by applying Gauss's theorem to both sides or members of each of the equations (1) and (3). Further, the equations (5) and (6) are applied to a hatched region Ω provided around each mesh point, as illustrated in FIG. 1A.

$$-\frac{1}{q}\oint_{\partial\Omega} J_n \cdot n d(\partial\Omega) = \int\int_\Omega \left(G_n - R_n - \frac{\partial n}{\partial t}\right) d\Omega \tag{5}$$

$$-\frac{1}{q}\oint_{\partial\Omega} J_p \cdot n d(\partial\Omega) = \int\int_\Omega \left(G_p - R_p - \frac{\partial p}{\partial t}\right) d\Omega \tag{6}$$

This hatched region Ω is called a control volume and is a simply-connected closed domain formed by sequentially connecting the circumcenters of a group of triangles having mesh edges connected to a mesh point i in common. Further, "∂Ω" designates the circumference of the region Ω.

A practical process of applying Gauss's theorem thereto will be described hereinbelow. First, a triangle ijk having the mesh point i in common is extracted as illustrated in FIG. 1B. Further, the following equations (7) and (8) are obtained correspondingly to a micro-region oim by making approximations of the equations (5) and (6).

$$-\frac{1}{q} w_{ij} J_n(i, j) = S_{ij}\left(G_n(i, j) - R_n(i, j) - \frac{\partial n(i)}{\partial t}\right) \tag{7}$$

$$-\frac{1}{q} w_{ij} J_p(i, j) = S_{ij}\left(G_p(i, j) - R_p(i, j) - \frac{\partial p(i)}{\partial t}\right) \tag{8}$$

In the equations (7) and (8), wij designates a current passage cross-section allotted to a mesh edge ij. Sij denotes the size of the control volume allocated to the same mesh edge ij.

Further, Jn(i,j) and Jp(i,j) denote the electron current density and the hole current density of currents flowing through the mesh edge ij, respectively. Gn(i,j), Rn(i,j), Gp(i,j) and Rp(i,j) represent an electron generation rate, an electron recombination rate, a hole generation rate, and a hole recombination rate in the micro-region oim. Moreover, n(i) and p(i) designates an electron density and a hole density at the mesh point i, respectively. On the other hand, the densities of currents flowing through the mesh edge ij are given by the following equations (9) to (11), which are equivalent to the equation (3.68) described in the first literature and the equation (3) described in the second literature, by using the Scharfetter-Gummel scheme described on pages 119–122 of the first literature.

$$J_n(i, j) = q \frac{\mu_n(i, j)}{l_{ij}} \frac{kT}{q} \left[\beta\left(\frac{\mu_n(i, j)(\varphi(j) - \varphi(i))}{D_n(i, j)}\right) n(j) - \beta\left(\frac{\mu_n(i, j)(\varphi(i) - \varphi(j))}{D_n(i, j)}\right) n(i)\right] \tag{9}$$

$$J_p(i, j) = q \frac{\mu_p(i, j)}{l_{ij}} \frac{kT}{q} \left[\beta\left(\frac{\mu_p(i, j)(\varphi(i) - \varphi(j))}{D_p(i, j)}\right) p(j) - \beta\left(\frac{\mu_p(i, j)(\varphi(j) - \varphi(i))}{D_p(i, j)}\right) p(i)\right] \tag{10}$$

$$\beta(x) = \frac{x}{\exp(x) - 1} \tag{11}$$

In the equations (9) to (11), ψ(i), ψ(j), n(i), n(j), p(i), and p(j) denote the electrostatic potential at the mesh point i, the electrostatic potential at the mesh point j, the electron densities at the mesh points i and j, and the hole densities at the mesh points i and j, respectively. Further, $\mu n(i,j)$ and $\mu p(i,j)$ denote the mobility of electrons and that of holes on the mesh edge ij. Dn(i,j) and Dp(i,j) represent the electron diffusion constant and the hole diffusion constant on the mesh edge ij, respectively. The following equations (12) and (13) are derived by adding up the quantities on both sides of the equations (9) and (10) over all of the micro-regions each of which has the mesh point i.

$$-\frac{1}{q}\sum_j w_{ij} J_n(i,j) = \sum_j S_{ij}\left(G_n(i,j) - R_n(i,j) - \frac{\partial n(i)}{\partial t}\right) \quad (12)$$

$$\frac{1}{q}\sum_j w_{ij} J_p(i,j) = \sum_j S_{ij}\left(G_p(i,j) - R_p(i,j) - \frac{\partial p(i)}{\partial t}\right) \quad (13)$$

By performing the herein-above described operation on all mesh points, discretized equations are obtained from the current continuity equations. Incidentally, the discretized equations are the following ones (14) and (15) in the case that a semiconductor device is in a stationary state and that on the other hand, the carrier recombination are negligible because the generation of electrons and holes owing to impact ionization are dominant.

$$\frac{\partial n(i)}{\partial t} = \frac{\partial p(i)}{\partial t} = 0 \quad (14)$$

$$R_n(i,j) = R_p(i,j) \approx 0 \quad (15)$$

Therefore, on the right-hand sides of the equations (12) and (13), terms other than Gn(i,j) and Gp(i,j) are negligible. Further, the modeling of the term corresponding to the generation of electrons and holes by impact ionization is achieved by using a model equation formulated as the following equation (16) which is similar to the equation (1) described on page 2076 of the aforementioned second literature.

$$G_n(i,j) = G_p(i,j) = \frac{1}{q}(\alpha_n(i,j)|\overline{J_n(i,j)}| + \alpha_p(i,j)|\overline{J_n(i,j)}|) \quad (16)$$

In the equation (16), $\alpha n(i,j)$ and $\alpha p(i,j)$ designate the ionization coefficient of electrons and that of holes, respectively. Moreover, in the equation (16), overlined Jn(i,j) and Jp(i,j) respectively denote the electron current density and the hole current density which are obtained by projecting an average current density, which is obtained in the triangle (namely, a triangular element) ijk, onto the mesh edge ij.

$$\overline{J_n(i,j)} \quad (F1)$$

$$\overline{J_p(i,j)} \quad (F2)$$

As is apparent from the description in the left column on page 2078 of the second literature, the values of these electron and hole current densities are expressed as the following equations (17) and (18) by a linear combination of actual current densities on edges of the triangular element ijk.

$$\overline{J_n(i,j)} = \sum_{m,n} a_{mn} J_n(m,n) \quad (17)$$

$$\overline{J_p(i,j)} = \sum_{m,n} a_{mn} J_p(m,n) \quad (18)$$

Current continuity equations in the case of the stationary state and impact ionization component is dominant, are obtained from the equations (12) to (18) and are expressed as the following equations (19) and (20).

$$-\frac{1}{q}\sum_j w_{ij} J_n(i,j) = \quad (19)$$

$$\frac{1}{q}\sum_j S_{ij}\left(\alpha_n(i,j)\left|\sum_{m,n} a_{mn} J_n(m,n)\right| + \alpha_p(i,j)\left|\sum_{m,n} a_{mn} J_p(m,n)\right|\right)$$

$$\frac{1}{q}\sum_j w_{ij} J_p(i,j) = \quad (20)$$

$$\frac{1}{q}\sum_j S_{ij}\left(\alpha_n(i,j)\left|\sum_{m,n} a_{mn} J_n(m,n)\right| + \alpha_p(i,j)\left|\sum_{m,n} a_{mn} J_p(m,n)\right|\right)$$

The simulation of an impact ionization phenomenon occurring in the stationary state of a semiconductor device is enabled by setting up a system of equations from the equations (9) to (11), (19), and (20) together with the Poisson equation expressed as the following equation (21) and by then solving the system of equations by the use of a suitable boundary condition.

$$\nabla \cdot (\epsilon \nabla \psi) = -q(p - n + N_D - N_A) \quad (21)$$

The herein-above described prior art method of simulating an impact ionization phenomenon occurring in a semiconductor device has encountered the problem in that instability occurs when calculating data representing a state where a noticeable impact ionization is caused in a high electric field.

Hereinafter, the causes of an occurrence of this instability will be described by taking a one-dimensional structure as an example, for simplicity of description. FIG. 2 shows three of equally spaced mesh points of an one-dimensional mesh. In this figure, $\psi i$, ni and pi designate the electrostatic potential, the electron density, and the hole density obtained at the mesh point i, respectively. Jn(i−1,i) and Jp(i−1,i) denote the electron current density, and the hole current density of currents flowing between the mesh points i and (i−1), respectively. Further, $\alpha n(i-1,i)$ and $\alpha p(i-1,i)$ designate the ionization coefficient of electrons and that of holes between the mesh points i and (i−1), respectively. Moreover, L denotes the distance between the mesh points and is constant regardless of places in the structure. Furthermore, the length S of a diagonally shaded region shown in FIG. 2 indicates the size of the control volume, which is assigned to the corresponding mesh point, and is constant irrespective of places in the structure. Incidentally, in the following description, only the electron current continuity equation will be considered for simplicity of description. By applying the equation (19) to the mesh point i, the following equation (22) is obtained.

$$-\frac{1}{q}[J_n(i, j+1) - J_n(i-1, i)] = \quad (22)$$

$$\frac{1}{q}L\left[\frac{1}{2}\alpha_n(i-1, i)J_n(i-1, i) - \frac{1}{2}\alpha_n(i, i+1)J_n(i, i+1) - \frac{1}{2}\alpha_p(i-1, i)J_p(i-1, i) + \frac{1}{2}\alpha_p(i, i+1)J_p(i, i+1)\right]$$

In the equation (22), the hole current component is left on the right-hand side on the supposition that the hole current component is given from the exterior of the structure. On the other hand, the electron current components are gathered on the left-hand side of the equation (22). Thus, the following equation (23) is obtained.

$$-\frac{1}{q}\left[\left(1 - \frac{L}{2}\alpha_n(i+1, i)\right)J_n(i, i+1) - \left(1 - \frac{L}{2}\alpha_n(i-1, i)\right)J_n(i-1, i)\right] = \quad (23)$$

$$\frac{1}{q}L\left[-\frac{1}{2}\alpha_p(i-1, i)J_p(i-1, i) + \frac{1}{2}\alpha_p(i, i+1)J_p(i, i+1)\right]$$

Furthermore, the equation (9) is substituted for Jn(i,i+1) and Jp(i,i+1), so that the following equation (24) is obtained.

$$-\frac{kT}{Lq}\left[-\left\{\left(1 - \frac{L}{2}\alpha_n(i, i+1)\right)\mu_n(i, i+1)\beta_e(i+1, i) + \right.\right. \quad (24)$$

$$\left(1 - \frac{L}{2}\alpha_n(i-1, i)\right)\mu_n(i-1, i)\beta_e(i, i+1)\right\}n(i) +$$

$$\left(1 - \frac{L}{2}\alpha_n(i, i+1)\right)\mu_n(i, i+1)\beta_e(i+1, i)n(i+1) +$$

$$\left.\left(1 - \frac{L}{2}\alpha_n(i-1, i)\right)\mu_n(i-1, i)\beta_e(i, i-1)n(i-1)\right] =$$

$$\frac{1}{q}L\left[-\frac{1}{2}\alpha_p(i-1, i)J_p(i-1, i) + \frac{1}{2}\alpha_p(i, i+1)J_p(i, i+1)\right]$$

Further, βe(i,j) is expressed as the following equation (25) by using the equation (11).

$$\beta_e(i, j) = \beta\left(\frac{\mu_n(i, j)(\varphi(i) - \varphi(j))}{D_n(i, j)}\right) \quad (25)$$

Then, attention is paid to the coefficient represented by the expression (26), which corresponds to the electron density n(i) at the mesh point i in the equation (24).

$$\frac{kT}{Lq}\left\{\left(1 - \frac{L}{2}\alpha_n(i, i+1)\right)\mu_n(i, i+1)\beta_e(i+1, i) + \right. \quad (26)$$

$$\left.\left(1 - \frac{L}{2}\alpha_n(i-1, i)\right)\mu_n(i-1, i)\beta_e(i-1, i)\right\}$$

The coefficient represented by the expression (26) takes an extremely small value when the magnitude of the electric field rises and the ionization coefficient satisfies the following equation (27). Moreover, the coefficient represented by the expression (26) may become zero at the worst.

$$\alpha_n(i, i+1) \simeq \alpha_n(i-1, i) \simeq \frac{2}{L} \quad (27)$$

Namely, the coefficient corresponding to n(i) may become zero. This means that n(i) may take an arbitrary value. Furthermore, this causes the instability of the entire simulation.

In the foregoing description, the one-dimensional structure has been taken as an example, for simplicity of description. However, even in the cases of the two-dimensional and three-dimensional structures respectively corresponding to the equations (19) and (20), the situation is similar to that in the case of the one-dimensional structure. Namely, when the ionization coefficient increases as a result of the rise in the magnitude of the electric field, the simulation encounters a situation in which the coefficient corresponding to the carrier density in the discretized current continuity equation becomes zero. As a result, the simulation becomes unstable. This instability of the simulation is caused by the use of the formulation by which an amount of generated carriers is first evaluated by using the current density of electric currents flowing from control volumes, and by which the evaluated amounts of generated carriers are then assigned to the control volumes that act as sources of electric current, and a positive feedback is locally performed. As a measure to avoid an occurrence of the instability, there has been devised a prior art method of shifting a point, at which the coefficient corresponding to the carrier density becomes zero, toward a high electric field side by decreasing the distance L between mesh points. However, generally, the ionization coefficient α increases exponentially with an increase in the magnitude of the electric field E, as is understood from the equation (28).

$$\alpha(E) = a|E|\exp\left(-\frac{b}{|E|}\right) \quad (28)$$

Thus, in the case of employing this method, the required number of elements of a mesh increases exponentially with an increase in the magnitude of the electric field E to be analyzed. Consequently, a computation time duration exponentially increases. Therefore, this prior art method is of no practical use.

Hereinafter, a method of simulating impact ionization phenomena, which occur in semiconductor devices, according to the present invention will be described.

In the case of the method of the present invention, at the upstream side where carriers are caused to drift, what is called a "seed" current density of currents exhibited before undergoing the multiplication due to impact ionization is employed as an evaluation value of the current density. In contrast, at the downstream side, a "multiplied" current density of currents after undergoing the multiplication is used as an evaluation value of the current density. Therefore, the carrier multiplication effects obtained by impact ionization always affect only mesh points at the downstream side. Further, no local feedback is provided to mesh points, which act as sources of electric current, at the upstream side. Thus, the coefficient corresponding to (or related to) the carrier density in the equation obtained by the discretization of the current continuity equation does not become zero. Consequently, the simulation can be stably performed.

Moreover, in the case of the method of the present invention, the evaluation value of the current density at the downstream side is represented as a constant multiple of the evaluation value of the current density at the upstream side by evaluating a rate of carrier generation resulting from self-multiplication of a carrier, which is caused by impact ionization, by multiplying the evaluation value of the current density at the upstream side, at which the carriers are caused to drift, by an ionization coefficient corresponding to an interval at the upstream side. Thus, basically, the evaluation values of the current density at the upstream side and at the downstream side can be efficiently calculated by using the same techniques.

Furthermore, in the case of the method of the present invention, a rate of generation of a carrier of interest owing to carrier self-multiplication, which is caused by impact ionization of a carrier other than the carrier of interest, is evaluated by multiplying the evaluation value of the current density at the upstream side, at which the carrier other than the carrier of interest is caused to drift, by an ionization coefficient corresponding to an interval at the upstream side. Additionally, an integrated amount of the generated carriers is allotted to a right-hand side of a current continuity equation of the carrier of interest at a mesh point at the downstream side of the carrier other than the carrier of interest. Thus, the effects of multiplication of other carriers, which are obtained by impact ionization thereof always affect only mesh points at the downstream side thereof. Consequently, this enables the simulation which is consistent with the treatment at the time of formulating the current continuity equation corresponding to carriers other than the carrier of interest.

Meanwhile, an embodiment of the method of simulating an impact ionization phenomenon occurring in the semiconductor device according to the present invention will be described in detail herein below.

First Embodiment

Figure 3:
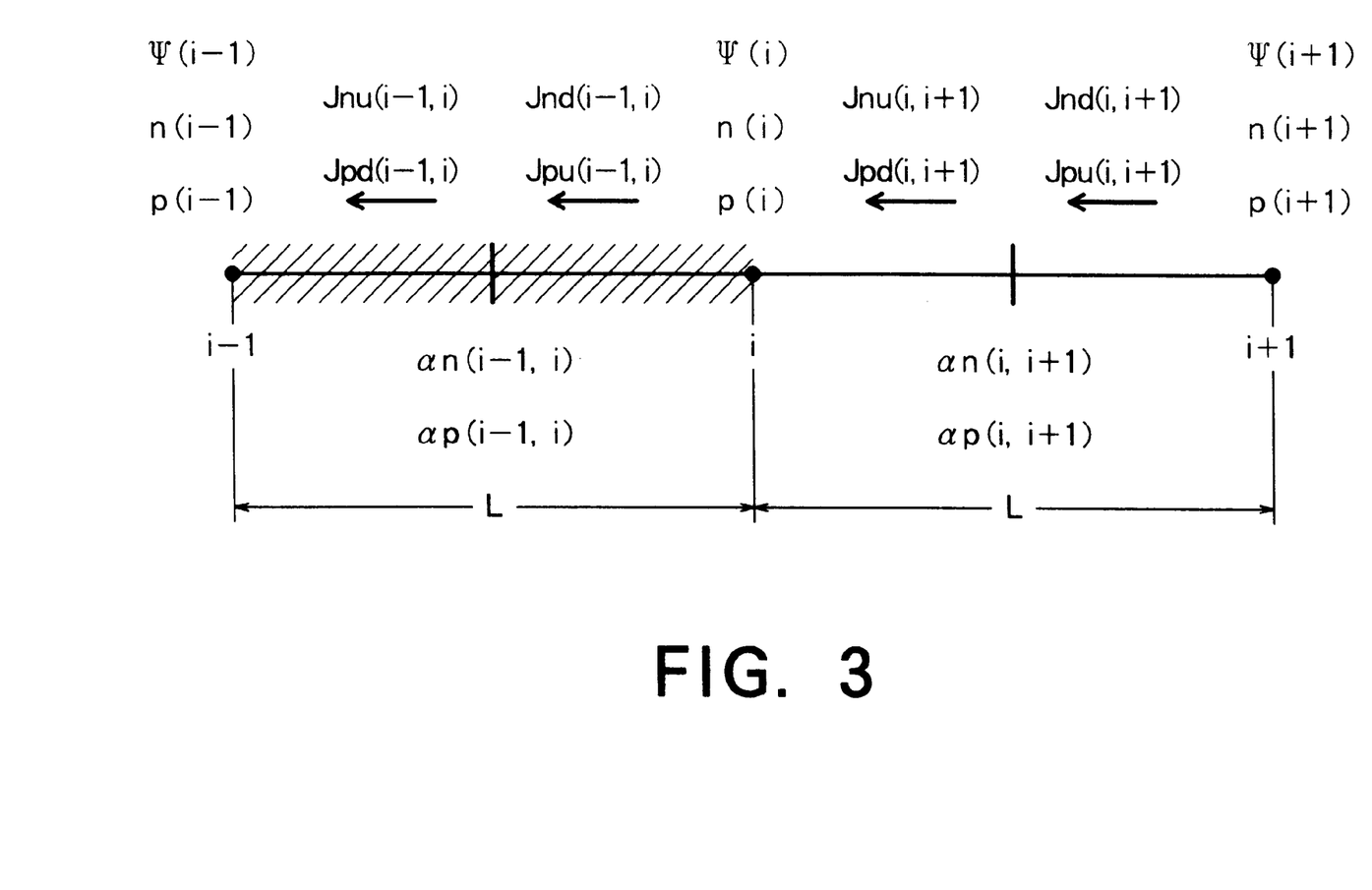
FIG. 3 is a diagram illustrating the positional relation among various kinds of physical quantities in the case of applying a method of simulating an impact ionization phenomenon according to the present invention, onto a one-dimensional structure.

FIG. 3 is a diagram illustrating a method of simulating an impact ionization phenomenon occurring in the semiconductor device, which is a first embodiment of the present invention. The first embodiment will be described hereunder by taking a one-dimensional structure as an example. Incidentally, in the following description, attention is directed only to the electron current continuity equation for simplicity of description. Referring to FIG. 3, the potential at each mesh point is assumed to satisfy the following inequality (29).

$$\psi(i-1) << \psi(i) << \psi(i+1) \tag{29}$$

Then, electrons move from the mesh point (i−1) to the mesh point i and further, moves therefrom to the mesh point (i+1) mainly owing to the drift. Electron current flows from the mesh point (i+1) to the mesh point i and further flows therefrom to the mesh point (i−1) with this movement of the electrons. Incidentally, in the case of the method of the present invention, different current densities are used at both sides of the boundary of the control volume, even if both sides thereof are placed on the same mesh edge. For example, in the case that electrons move on the mesh edge connecting the mesh points (i−1) and i, Jnu(i−1,i) is used as the current density of currents flowing out of the mesh point (i−1), from which the electrons move, at the upstream side. On the other hand, Jnd(i−1,i) is used as the current density of currents flowing toward the mesh point i, which is the destination of the electrons, at the downstream side. When the electrons undergo the multiplication by the impact ionization, Jnd(i−1,i) is larger than Jnu(i−1,i) by an increase in the current density due to the multiplication and satisfies the following equation (30).

$$|J_{nd}(i-1,i)| = |J_{nu}(i-1,i)| + LG^*_{nn}(i-1,i) \tag{30}$$

In this equation, G*nn(i−1) designates an electron generation rate of electrons generated by the impact ionization of the electrons themselves, in a diagonally shaded interval [i−1, i] in FIG. 3. Further, L denotes the distance between the mesh points. Thus, the multiplying of the generation rate by L means that the generation rate is integrated between the mesh points (i−1) and i along the interval [i−1, i]. If the generation of electrons due to the impact ionization of the electrons themselves is considered as the increase of what is called the "seed" current at the upstream side, which undergoes the multiplication, G*nn(i−1,i) can be represented by the following equation (31).

$$G^*_{nn}(i-1,i) = \alpha_n(i-1,i)|J_{nu}(i-1,i)| \tag{31}$$

Thus, Jnd(i−1,i) is given by the following equation (32). Namely, Jnd(i−1,i) is obtained by simply multiplying the current at the upstream side by (1+Lαn(i−1,i)).

$$J_{nd}(i-1,i) = (1 + L\alpha_n(i-1,i))J_{nu}(i-1,i) \tag{32}$$

Similarly, the current density corresponding to the mesh edge connecting the mesh points i and (i+1) with each other is obtained as the following equation (33).

$$J_{nd}(i,i+1) = (1 + L\alpha_n(i,i+1))J_{nu}(i,i+1) \tag{33}$$

Thus, by using different current densities at both of the upstream side and the downstream side from the boundary of the control volume on the edge through which electrons move, respectively, the effects of the electron generation by the impact ionization of electrons themselves can be represented as the difference between these current densities. Therefore, the incorporating of such effects into the right-hand side of the current continuity equation is unnecessary. On the other hand, this is a care that the generation of some electrons is caused by the impact ionization of holes.

In this case, the incorporating of a generation term, which corresponds to the electron generation by the impact ionization of holes, must be introduced into the right-hand side of the current continuity equation, similarly as in the case of the prior art method.

The present invention aims mainly at allocating carriers generated by the impact ionization to the mesh points at the downstream side to thereby eliminate a direct feedback to the upstream side. Therefore, regarding the electron generation caused by the impact ionization of holes, for instance, holes exhibiting what is called the "seed" current density Jpu(i, i+1) at the mesh point (i+1) at the upstream side on the edge where the holes move, the electron generation term described in the following equation (34) is allocated to the mesh point i in accordance with the aim of the present invention.

$$G^*_{np}(i,i+1) = \alpha_p(i,i+1)|J_{pu}(i,i+1)| \tag{34}$$

Further, the discretized electron current continuity equation corresponding to the mesh point i is obtained as the following equation (35) by combining an expression, which is obtained by substituting the equation (9) for the upstream-side current density expression, with the electron generation term due to the impact ionization of holes.

$$-\frac{kT}{Lq}[-\{\mu_n(i, i+1)\beta_e(i+1, i) + \tag{35}$$

$$(1 + L\alpha_n(i-1, i))\mu_n(i-1, i)\beta_e(i, i-1)\}n(i) +$$

$$\mu_n(i, i+1)\beta_e(i+1, i)n(i+1) + (1 + L\alpha_n(i-1, i))$$

$$\mu_n(i-1, i)\beta_e(i, i-1)n(i-1)] = \frac{1}{q}L\alpha_p(i, i+1)J_{pu}(i+1)$$

In the case of the equation (35), the coefficient corresponding to the electron density n(i) at the mesh point i is always positive. Thus, even when strong impact ionization occurs, the method of the present invention does not cause the instability, which would be caused in the case of employing the prior art method, in the simulation. Further, although different current density expressions should be used at the upstream and the downstream sides of the control volume, respectively, the current density at the downstream side is obtained by simply multiplying the value of the current density at the upstream side by (1+Lαn). Namely, basically, both of the current densities respectively used at the upstream and the downstream sides can be easily calculated from a same expression.

In the case of the method of the present invention, it is necessary to judge which of the mesh points at both ends of a mesh edge is at the upstream side in a carrier flow. Such a judgement, however, can be easily performed by comparing the values of the potential at both of the mesh points with each other. Namely, if $\psi(i) << \psi(j)$, the mesh point i is at the upstream side in the case that the carriers are electrons. Further, in the case that the carriers are holes, the mesh point j is at the upstream side.

Second Embodiment

Figure 4A:
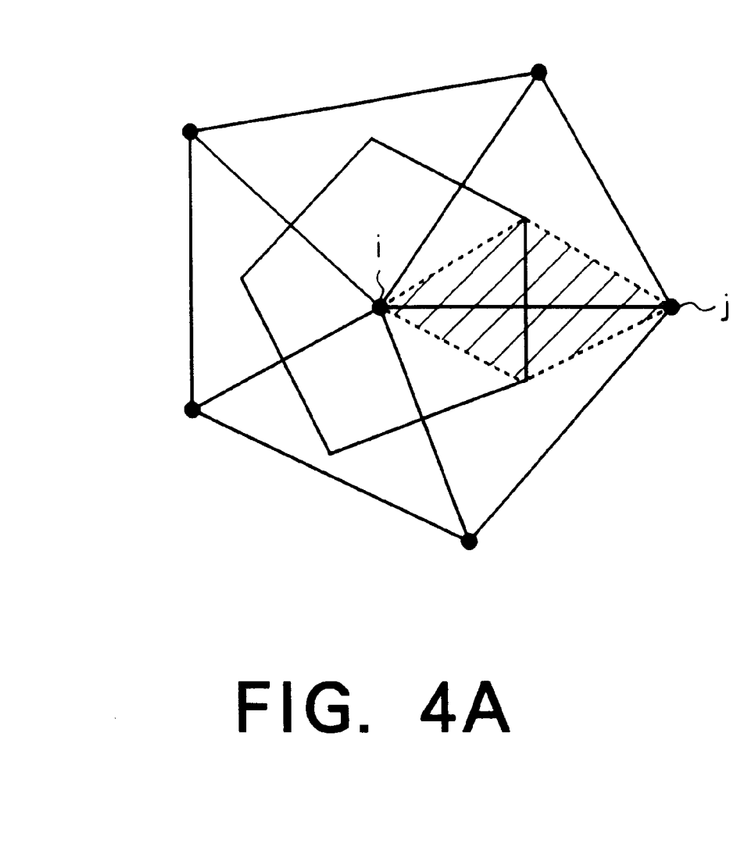
FIGS. 4A and 4B are diagrams illustrating the positional relation among various kinds of physical quantities in the case of applying the method of simulating impact ionization phenomena according to the present invention, onto a two-dimensional structure.
Figure 4B:
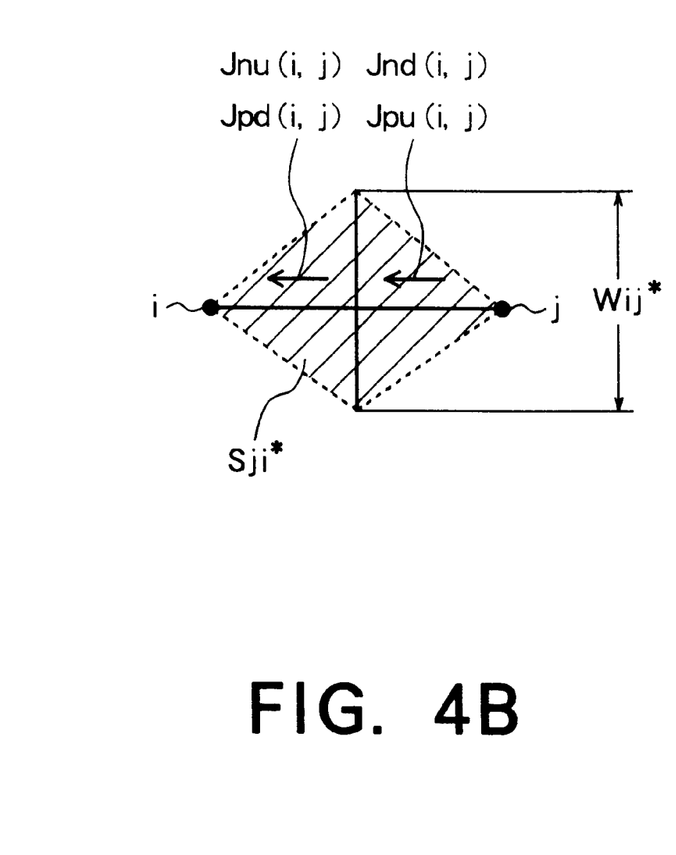

FIGS. 4A and 4B are diagrams illustrating a method of simulating an impact ionization phenomenon occurring in the semiconductor device, which is a second embodiment of the present invention. The second embodiment will be described hereunder by taking a two-dimensional structure as an example.

FIG. 4A illustrates the positional relation among a mesh point i, the boundary of a control volume, which comprises the mesh point i and mesh points adjacent thereto, and an adjoining mesh point j. Further, FIG. 4B shows a diagonally shaded region illustrated in and extracted from FIG. 4A. In FIG. 4B, $S^*_{ij}$ designates the area of the diagonally shaded region. Moreover, $w^*_{ij}$ denotes the length of the boundary of the control volume between the mesh points i and j. The relation between the upstream-side electron current density and the downstream-side electron current density is obtained as the following equation (36) in the region between the mesh points i and j, similarly as in the case of the equation (30).

$$w^*_{ij}|J_{nd}(i,j)|=w^*_{ij}|J_{nu}(i,j)|+S^*_{ij}G^*_{nm}(i,j) \qquad (36)$$

Moreover, the following equation (37) is obtained by representing the electron generation rate owing to the self-multiplication of electrons by impact ionization, similarly as in the case of the equation (31).

$$G^*_{nn}(i,j)=\alpha_n(i,j)|J_{nu}(i,j)| \qquad (37)$$

Thus, the downstream-side electron current density Jnd (i,j) is given by the following equation (38).

$$J_{nd}(i,j) = \left(1+\frac{S^*_{ij}}{w^*_{ij}}\alpha_n(i,j)\right)J_{nu}(i,j) \qquad (38)$$

As is seen from the equation (38), the downstream-side electron density is obtained by multiplying the upstream-side electron density by $(1+S^*_{ij}/w^*_{ij}\alpha n(i,j))$, similarly as in the case of the equation (33). Furthermore, regarding the rate of electron generation due to the impact ionization of holes, the rate obtained by multiplying the following equation (39) using Jpu(i,j) by $S^*_{ij}$ is allotted to the mesh point i.

$$G^*_{np}(i,j)=\alpha_p(i,j)|J_{pu}(i,j)| \qquad (39)$$

Similarly as in the case of the first embodiment of the present invention, the coefficient of a term corresponding to the carrier density at the mesh point i in the discretized current continuity equation can be maintained at a positive value by performing such an operation. Consequently, the method of the present invention can avoid an occurrence of the instability, which is the problem occurring in the prior art method, in the region where notable impact ionization occurs.

Incidentally, the aforementioned method of simulating an impact ionization phenomenon occurring in a semiconductor device according to the present invention can be performed by a computer in which a program for performing this method is prepared. Additionally, even if this program is recorded on a recording medium, the method of simulating an impact ionization phenomenon occurring in a semiconductor device according to the present invention can be performed.

Although the preferred embodiments of the present invention have been described above, it should be understood that the present invention is not limited thereto and that other modifications will be apparent to those skilled in the art without departing from the spirit of the invention.

The scope of the present invention, therefore, is to be determined solely by the appended claims.

What is claimed is:

1. A method of simulating an impact ionization phenomenon of a semiconductor device for obtaining an electric characteristic concerning the impact ionization phenomenon of the semiconductor device by the steps of:

inputting region, structure, and impurity profiles of said semiconductor device to be analyzed;

setting a mesh in a space of the region of said region profile solving a Poisson equation, an electron current continuity equation, and a hole continuity equation which are discretized by a control volume method; and outputting said electronic characteristic concerning the impact ionization phenomenon;

wherein a coefficient, corresponding to a carrier density in an equation obtained by discretizing the electron current continuity equation and the hole current continuity equation, does not become zero.

2. The method of simulating an impact ionization phenomenon of a semiconductor device as claimed in claim 1, wherein regarding a current density defined on a mesh edge connecting adjacent mesh points, different values are used as an evaluation value of the current density at an upstream side, at which a carrier is caused to drift, and an evaluation value of the current density at a downstream side, respectively.

3. The method of simulating an impact ionization phenomenon of a semiconductor device as claimed in claim 2, which further comprises a step of setting a difference between the current densities respectively obtained at the upstream side and the downstream side in such a manner as to be equal to a multiplication carrier current density caused by impact ionization of the carrier in the control volume corresponding to an edge of the mesh.

4. The method of simulating an impact ionization phenomenon of a semiconductor device as claimed in claim 3, which further comprises a step of representing the evaluation value of the current density at the downstream side as an integral multiple of the evaluation value of the current density at the upstream side by evaluating a rate of carrier generation resulting from self-multiplication of a carrier, which is caused by impact ionization, by multiplying the evaluation value of the current density at the upstream side, at which the carrier is caused to drift, by an ionization coefficient corresponding to an interval at the upstream side.

5. The method of simulating an impact ionization phenomenon of a semiconductor device as claimed in claim 3, which further comprises the steps of:

evaluating a rate of generation of a carrier of interest owing to carrier self-multiplication, which is caused by impact ionization of a carrier other than the carrier of interest, by multiplying the evaluation value of the current density at the upstream side, at which the carrier other than the carrier of interest is caused to drift, by an ionization coefficient corresponding to an interval at the upstream side; and allotting an integrated amount of the generated carriers to a right-hand side of a current continuity equation of the carrier of interest at a mesh point at the downstream side of the carrier other than the carrier of interest.

6. The method of simulating an impact ionization phenomenon of a semiconductor device as claimed in claim 1, wherein said space is one-dimensional, two-dimensional or three-dimensional.

7. A recording medium recording a program for performing the method of simulating an impact ionization phenomenon of a semiconductor device as claimed in claim 1.

* * * * *